(12) United States Patent
Hayashi (10) Patent No.: US 7,391,498 B2
(45) Date of Patent: Jun. 24, 2008

(54) TECHNIQUE OF SUPPRESSING INFLUENCE OF CONTAMINATION OF EXPOSURE ATMOSPHERE

(75) Inventor: Tatsuya Hayashi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 791 days.

(21) Appl. No.: 10/949,184

(22) Filed: Sep. 24, 2004

(65) Prior Publication Data

US 2005/0069433 A1  Mar. 31, 2005

(30) Foreign Application Priority Data

Sep. 29, 2003  (JP)  ............................. 2003-337562
Aug. 23, 2004  (JP)  ............................. 2004-242229

(51) Int. Cl.
*G03B 27/42* (2006.01)
*G03B 27/52* (2006.01)

(52) U.S. Cl. .......................................... 355/53; 355/30

(58) Field of Classification Search .................. 355/53, 355/30, 72, 75; 417/423.4
See application file for complete search history.

(56) References Cited

U.S. PATENT DOCUMENTS

2001/0050759 A1 * 12/2001 Kamiya ....................... 355/30
2005/0030504 A1 *  2/2005 Terashima et al. ............ 355/53

FOREIGN PATENT DOCUMENTS

JP     2-199814   *  8/1990
JP     2003-45782    2/2003

* cited by examiner

*Primary Examiner*—Peter B Kim
(74) *Attorney, Agent, or Firm*—Morgan & Finnegan, LLP (57) ABSTRACT

An exposure apparatus includes a projection optical system which has a plurality of optical elements, and directs light from an original to an object to be exposed; a first stage which holds the object to be exposed; a first vacuum chamber which contains the first stage; and a second vacuum chamber which is adjacent to the first vacuum chamber, contains a part of the plurality of optical elements, and communicates with the first vacuum chamber through a first opening. The pressure in the second vacuum chamber is higher than pressure in the first vacuum chamber.

57 Claims, 7 Drawing Sheets

TECHNIQUE OF SUPPRESSING INFLUENCE OF CONTAMINATION OF EXPOSURE ATMOSPHERE

BACKGROUND OF THE INVENTION

1. Field of the Invention

This invention relates to the technique of suppressing the influence of the contamination of exposure atmosphere, which is suitable for use in the manufacture of a device having a fine pattern such as semiconductor devices.

This invention is particularly suitable for an exposing apparatus for effecting exposure by the use of light of a short wavelength (0.5 to 50 nm) like EUV light, or an exposing apparatus for effecting exposure under a high vacuum atmosphere by the use of an optical element such as a mirror or a lens.

2. Description of Related Art

In recent years, in the optical lithography technique for manufacturing semiconductors, the shortening of the wavelength of exposure light has been advanced and progress has been made from i-line and g-line to KrF excimer laser and ArF excimer laser. If the shortening of the wavelength of exposure light progresses, it will become possible to transfer a minuter mask pattern to a wafer. However, to expose a pattern of a thin line width, lithography using ultraviolet light is limited in principle. So, EUV lithography using extreme ultraviolet light (EUV light, 13 to 20 nm) of a shorter wavelength than ultraviolet light has been drawing attention.

A typical wavelength used in the EUV light is 13.5 nm and therefore, it is possible to realize resolution for exceeding that of the optical lithography hitherto, on the other hand, the EUV light has the nature that it is readily absorbed by substance. Therefore, if reduction exposure using a refractive optical system is effected as in the conventional lithography using ultraviolet light as a light source, the EUV light will be absorbed by a glass material and the quantity of light reaching a member to be exposed such as a wafer will become extremely small. Therefore, when exposure is to be effected by the use of the EUV light, it is necessary to configure reduction exposure using a reflecting optical system.

Figure 4:
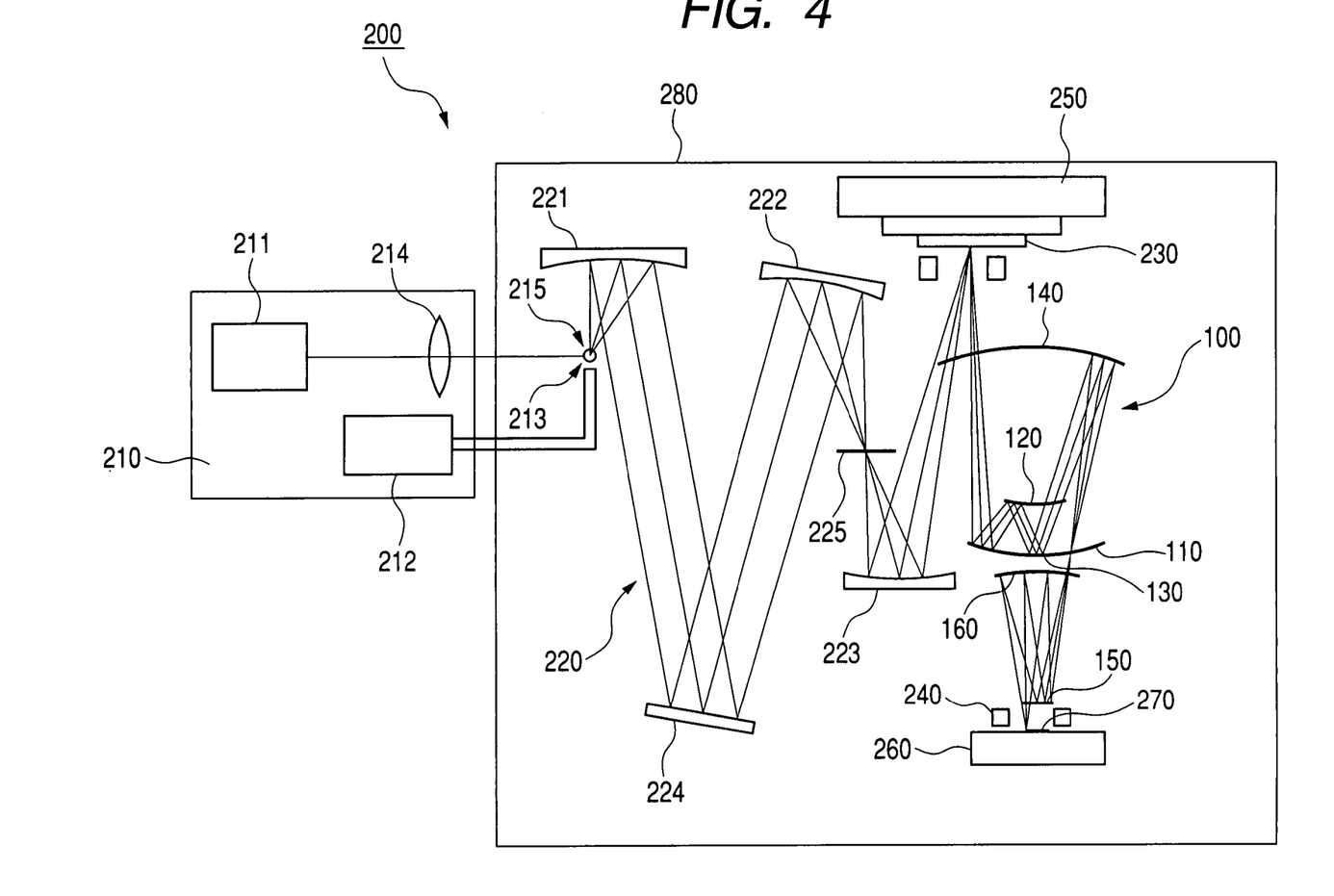
FIG. 4 is a schematic view of a conventional EUV exposing apparatus.

FIG. 4 is a schematic view of a conventional reduction projection exposing apparatus using the EUV light (see Japanese Patent Application Laid-Open No. 2003-45782). An EUV exposing apparatus 200 has an EUV light source 210, an illuminating optical system 220, a reticle (mask) 230, an alignment optical system 240, a reticle stage 250, a wafer stage 260, a wafer 270, a vacuum container 280, a reflection type reduction projection optical system 100, a first mirror 110, a second mirror 120, a third mirror 130, a fourth mirror 140, a fifth mirror 150 and a sixth mirror 160, and is also provided with an exhausting system, not shown, for exhausting gas in the vacuum chamber 280, etc.

There are several kinds of EUV light source, and a laser producing plasma light source which is one of them can emit light of only a substantially necessary wavelength band by the selection of a target material. When for example, Xe is ejected as a target material from a pulse nozzle, and a pulse laser is applied thereto to thereby generate plasma, EUV light of a wavelength 13-14 nm is emitted.

The illuminating optical system is comprised of a plurality of multi-layer film mirrors, an optical integrator, etc. As the roles of the illuminating optical system, mention may be made of efficiently condensing light emitted from the light source, and uniformizing the illuminance in an exposure area. Also, the optical integrator has the role of uniformly illuminating the mask at a predetermined numerical aperture.

The projection optical system is comprised of a reflecting optical system using a multi-layer film mirror alternately coated with Mo and Si. This Mo/Si multi-layer film can obtain normal-incidence reflectance of the order of 67% in the vicinity of a wavelength 13 nm. It is difficult in principle to provide reflectance of 100% and most of absorbed energy changes into heat. Therefore, low thermal expansion glass or the like is used for the base material of the mirror. In the reflecting optical system, a plurality of such Mo/Si multi-layer film mirrors are used for aberration correction, however, to keep the transmittance of the EUV light, it is necessary to minimize the number of the multi-layer film mirrors.

The reticle stage and wafer stage of the EUV exposing apparatus have mechanisms for driving under a vacuum environment, and the reticle stage and the wafer stage scan in synchronization with each other at a speed ratio proportional to a reduction magnification. Also, the positions and postures of the reticle stage and the waver stage are observed and controlled by a laser interferometer, not shown.

A reticle held by a reticle chuck and a wafer held by a wafer chuck are highly accurately positioned by fine motion mechanisms carried on the reticle stage and the wafer stage.

The alignment optical system is an apparatus for detecting the positional relation between the position of the reticle and the optical axis of the projection optical system, and the positional relation between the wafer and the optical axis of the projection optical system. Thereby, the positions and angles of the reticle stage and the wafer stage are set so that a projected image may be applied to a predetermined position on the wafer. Also, a focus position in a direction perpendicular to the surface of the wafer is detected by a focus detecting mechanism, and the position and angle of the wafer stage are controlled, whereby the imaging position on the surface of the wafer is always kept.

In order to avoid the absorption of the EUV light by substance, it is necessary that the space, to which the EUV light of the EUV exposing apparatus, is to be kept in vacuum. Therefore, a plurality of exhaust systems such as vacuum pumps are mounted on the exposing apparatus.

The EUV light used in the EUV exposing apparatus is absorbed by the atmosphere in the apparatus. Particularly, oxygen and moisture strongly absorb the EUV light. Therefore, to keep the transmittance of the EUV light high, it is necessary to render the interior of a chamber into a vacuum state by the utilization of a vacuum pump or the like. It is desirable that the pressure in the chamber through which the EUV light passes be $10^{-3}$ Pa or less and the partial pressure of oxygen and moisture be infinitely low. However, some of moisture adhered to the wafer during the conveyance of the wafer is diffused in the chamber. Further, moisture is liable to adhere to the inner wall of the chamber and is difficult to be exhausted. The adherence of moisture to the optical element becomes a cause of the oxidization of the optical element and the reduction of the reflectance of the optical element.

Also, when the interior of the chamber becomes a vacuum state, hydrocarbon is produced from the mechanism portions of the stages or the like. Further, reaction of resist by the exposure light during exposure also produces hydrocarbon, and when such hydrocarbon is applied to the exposure light on the surface of the optical element, it adheres as carbon to the surface of the optical element. The carbon adhered to the optical element absorbs the EUV light and reduces the reflectance of the optical element. The reduction of the reflectance of the optical element leads to a reduction in throughput.

Thus, particularly in the space where the optical element in the EUV exposing apparatus is installed, the partial pressure of moisture and hydrocarbon need be kept low.

To lower the partial pressure of moisture and hydrocarbon or the like in the exposing apparatus, the step of enhancing the capability of the exhaust system such as a vacuum pump is also effective. However, it is inevitable that the moisture adhering to the conveyed wafer and the hydrocarbon produced from the resist and the mechanism portions of the stages drift in the space, where the optical element is installed, due to diffusion and therefore, it is difficult to improve the throughput.

Also, at present, regarding the manufacture of semiconductor devices such as DRAM and MPU, research and development are being energetically made to realize a device having a line width of 0.1 μm or less in terms of the design rule. As an exposing apparatus for use in this generation, an exposing apparatus using the extreme ultraviolet light (EUV) is regarded as being potent. Since in the EUV exposing apparatus, exposure in the atmosphere is impossible, exposure cannot help being effected in vacuum.

In the EUV exposing apparatus, particles are produced by sliding movement and friction such as the operations of a robot hand and a gate value until a reticle and a wafer are conveyed to an apparatus chamber, and there has been the possibility of these particles adhering to the reticle and the wafer. Also, there has been the possibility that particles produced from movable portions such as stages and the like may adhere to the surfaces of the reticle and the wafer during exposure.

Such adherence of the particles to the surfaces of the reticle and the wafer has caused the problem the yield of the manufacture of the device and the reliability of the device are lowered. Particularly, if the particles adhere to the circuit pattern surface of the reticle, the particles will be transferred to the entirely same position at each shot in actual exposure. This has led to the problem that the yield of the manufacture of the device and the reliability of the device are greatly lowered.

SUMMARY OF THE INVENTION

The present invention has as its illustrative object to solve at least one of the above-mentioned problems of the prior art.

In order to achieve the above object, the present invention is provided with the following aspects.

According to the present invention, the above object is attained by providing an exposure apparatus which comprises a projection optical system having a plurality of optical elements and directing light from an original to an object to be exposed, a first stage which holds the object to be exposed, a first vacuum chamber which contains the first stage, and a second vacuum chamber which is adjacent to the first vacuum chamber, contains a part of the plurality of optical elements, and communicates with the first vacuum chamber through a first opening, wherein pressure in the second vacuum chamber is higher than pressure in the first vacuum chamber.

Further, the above object is also attained by providing an exposure apparatus which comprises a projection optical system which has a plurality of optical elements and directing light from an original to an object to be exposed, a first stage which holds the original, a first vacuum chamber which contains the first stage, and a second vacuum chamber which is adjacent to the first vacuum chamber, contains a part of the plurality of optical elements, and communicates with the first vacuum chamber through a first opening, wherein pressure in the second vacuum chamber is higher than pressure in the first vacuum chamber.

According to the present invention, there can be provided a technique of suppressing the influence of the contamination of exposure atmosphere which is suitable for use in the manufacture or the like of a device having a minute pattern such as a semiconductor device, and particularly the technique suitable for an EUV exposing apparatus or an exposing apparatus for effecting exposure under a high vacuum atmosphere by the use of an optical element.

Other objects and advantages than those discussed above will be apparent to those skilled in the art from the following description of preferred embodiments of the invention. In the description, reference is made to the accompanying drawings, which form a part thereof, and which illustrate an example of the invention. Such example, however, is not exhaustive of the various embodiments of the invention, and therefore, reference is made to the claims which follow the description for determining the scope of the invention.

DETAILED DESCRIPTION OF THE PREFERRED EMBODIMENTS

Some embodiments of the present invention will hereinafter be described in detail with reference to the accompanying drawings.

First Embodiment

Figure 1:
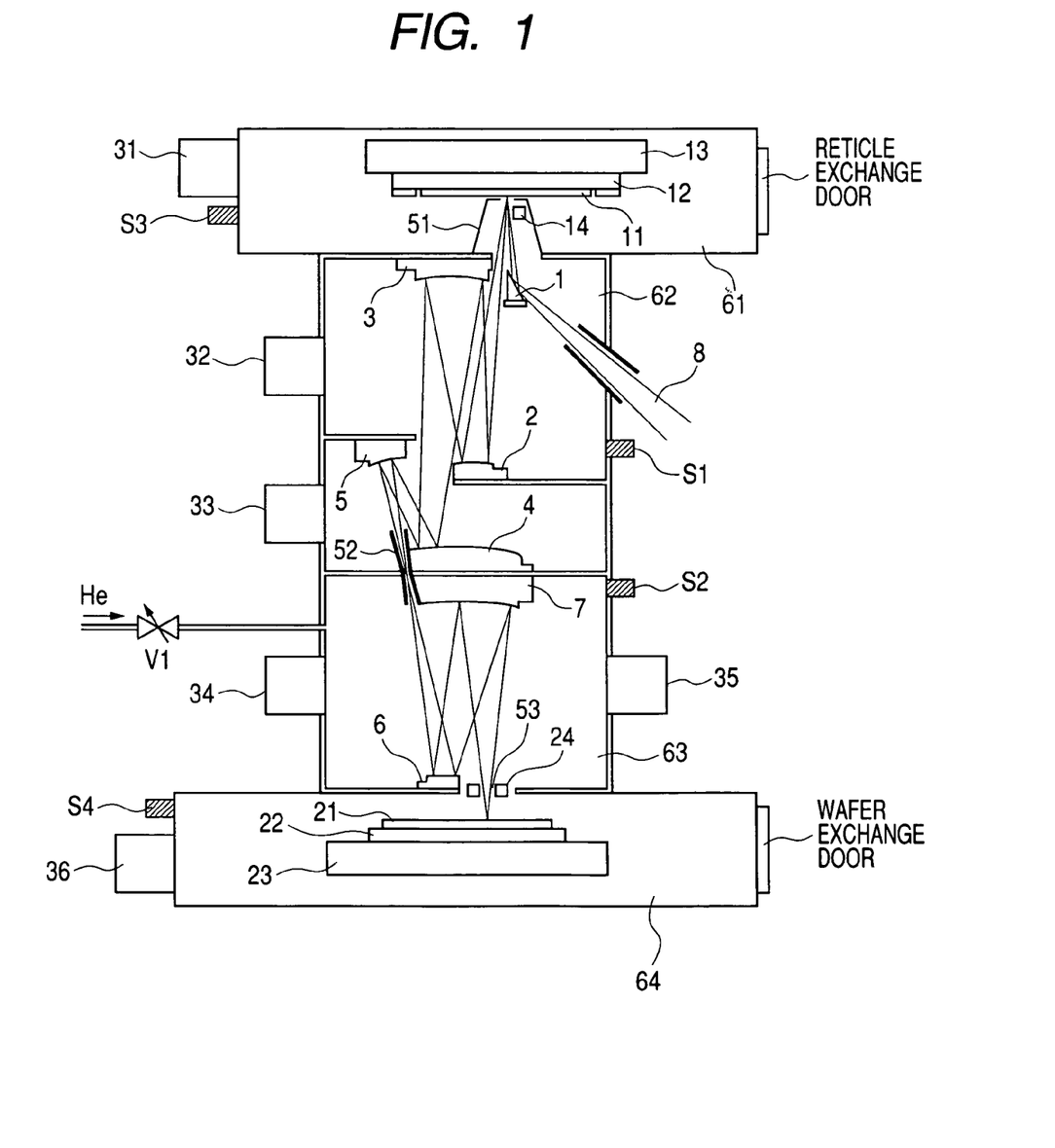
FIG. 1 is a schematic view of an EUV exposing apparatus according to a first embodiment of the present invention.

FIG. 1 shows a first embodiment of an exposing apparatus (exposure apparatus) using the EUV light (herein light of a wavelength of 0.1 to 30 nm, and preferably 10 to 15 nm) of the present invention.

In FIG. 1, the reference numeral 8 designates EUV light emitted from an EUV light source and directed by an illuminating optical system, not shown, and this EUV light 8 is applied to a reticle through the intermediary of a reticle illuminating mirror 1. The reference numeral 2 denotes a projection system first mirror, the reference numeral 3 denotes a projection system second mirror, the reference numeral 4 denotes a projection system third mirror, the reference numeral 5 denotes a projection system fourth mirror, the reference numeral 6 denotes a projection system fifth mirror, the reference numeral 7 denotes a projection system sixth mirror, the reference numeral 11 denotes a reflection type reticle, the reference numeral 12 denotes a reticle chuck, the reference numeral 13 denotes a reticle stage, the reference numeral 14 denotes a reticle alignment optical system, the reference numeral 21 denotes a wafer, the reference numeral 22 denotes a wafer chuck, the reference numeral 23 denotes a wafer stage, and the reference numeral 24 denotes a wafer alignment optical system.

There are several kinds of EUV light sources, not shown, and a laser generating plasma light source, which is one of them, can emit light of only a substantially necessary wavelength band by the selection of a target material. When for example, Xe is ejected as a target material from a pulse nozzle, and a pulse laser is applied thereto to thereby generate plasma, EUV light of a wavelength 13-14 nm is emitted.

The illuminating optical system, not shown, is comprised of a plurality of multi-layer film mirrors, an optical integrator, etc. As the roles of the illuminating optical system, mention may be made of efficiently condensing light emitted from the light source, and uniformizing the illuminance of an exposed area. Also, the optical integrator has the role of uniformly illuminating a mask at a predetermined numerical aperture.

The projection optical system is comprised of a plurality of multi-layer film mirrors alternately coated with Mo and Si. This multi-layer film has normal-incidence reflectance of the order of 67% for the EUV light and therefore, most of energy absorbed by the multi-layer film mirrors changes into heat. Therefore, low thermal expansion glass or the like is used as the base material of the mirrors.

The reticle stage 13 and the wafer stage 23 have mechanisms for driving under a vacuum environment, and scan in synchronization with each other at a speed ratio proportional to a reduction magnification. Also, the positions and postures of the reticle stage 13 and the wafer stage 23 are observed and controlled by a laser interferometer, not shown.

The reticle 11 is held by the reticle chuck 12 on the reticle stage 13. Also, the wafer 21 is held by the wafer chuck 22 on the wafer stage 23. The reticle stage 13 and the wafer stage 23 have fine motion mechanisms, and can position the reticle 11 and the wafer 21, respectively.

The alignment detecting mechanisms (not shown) residing in the reticle optical system 14 and the wafer alignment optical system 24, respectively, measure the positional relation between the position of the reticle and the optical axis of the projection optical system, and the positional relation between the wafer and the optical axis of the projection optical system, respectively. On the basis of the result of the measurement, the positions and angles of the reticle stage 13 and the wafer stage 23 are adjusted so that the projected image of the reticle may coincide with a predetermined position on the wafer.

Also, the focus position detecting mechanism (not shown) of the wafer alignment system 24 detects a focus position in a vertical direction on the surface of the wafer to keep the imaging position of the projection optical system on the surface of the wafer.

When one cycle of exposure is terminated, the wafer stage 23 is step-moved in X and Y directions, and is moved to the start position of the next scanning exposure and effects exposure again.

In this first embodiment, there is adopted a configuration in which a space including therein the projection optical system disposed between the reticle and the wafer is separated into a first projection system space 62 and a second projection system space 63, and an orifice member 52 is interposed between the two spaces, whereby a pressure difference can be produced between the first projection system space 62 and the second projection system space 63. The orifice member 52 may be of any shape if it is a member which can produce a pressure difference between the first projection system space 62 and the second projection system space 63. It may simply be a small opening, or as shown in FIG. 1, may be a cylindrical elongate member (the height of the cylinder may preferably be three or more times as great as the diameter of the thinnest portion of the cylinder, and may more preferably be five or more times).

Such an orifice member 52 as does not intercept exposure light as previously described is installed between the first projection system space 62 and the second projection system space 63. The first projection system space 62 can be kept at predetermined pressure by exhaust devices 32 and 33 such as turbo-molecular pumps connected thereto and a pressure sensor S1, and the second projection system space 63 can be kept at predetermined pressure by turbo-molecular pumps 34 and 35 and a pressure sensor S2. Further, the exposure apparatus has a valve (inert gas supplying device) V1 which supplies an inert gas such as helium into the second projection system space 63, and can control the mass flow rate of gas.

A shield member 51 having an opening portion for passing the exposure light and alignment light therethrough is disposed between a reticle stage space 61 and the first projection system space 62. Here, the distance between the shield member 51 and the reticle is set to be 1 mm or less. By the configuration, a pressure difference can also be produced between the reticle stage space 61 and the first projection system space 62.

This reticle stage space 61 can be kept at predetermined pressure by an exhaust device 31 such as a turbo-molecular pump connected thereto and a pressure sensor S3. Also, the first projection system space 62 can be kept at predetermined pressure by the exhaust devices 32 and 33 such as the turbo-molecular pumps connected thereto and the pressure sensor S1. If as described above, an operative exhaust system is configured between the reticle stage space 61 and the first projection system space 62 and the pressure in the first projection system space 62 is made higher than that in the reticle stage space 61, out gas produced from the reticle stage space 61 can be deterred from entering the first projection system space 62.

Next, between the second projection system space 63 and a wafer stage space 64, a wafer stage space opening portion 53, which does not intercept the exposure light, is disposed. Also, the wafer stage space 64 is kept at predetermined pressure by a turbo-molecular pump 36 connected thereto and a pressure sensor S4.

The out gas produced from the mechanism portions or the like of the reticle stage 13 and the wafer stage 23 is exhausted by the use of a differential exhaust system, whereby it can be deterred from adhering to the mirror, etc. of the aforedescribed projection optical system.

However, The deterring effect of the out gas produced from resist during exposure by differential exhaust can be little expected because the wafer stage space opening portion 53 and the wafer are proximate to each other. So, helium is supplied to the second projection system space 63 by the utilization of the valve (inert gas supplying means) V1. The supplied helium fills the second projection system space 63, and is ejected from the orifice member 52 to the first projection system space 62, and from the wafer stage space opening portion 53 to the wafer stage space 64. At this time, the system is configured such that the pressure in the second projection system space 63 may be kept at the order of 1 to 10 Pa (or 0.1 to 100 Pa) and pressure of the first projection system space 62 and the wafer stage space 64 may be kept equal to or less than that in the second projection system space 63. By thus making the pressure in the wafer stage space 64 (and the first projection system space 62) adjacent to the second projection system space low relative to the pressure in the second projection system space 63, it becomes possible to effectively deter the out gas produced form the resist.

Further, by configuring such that the conductance of the orifice member 52 is lower than the conductance of the wafer stage space opening portion 53, it is possible to further deter the out gas produced from the resist from reaching the mirror of the projection optical system.

In order to confirm the above-described deterring effect by the supply of the inert gas, thermohydrodynamic simulation was carried out. The result is shown in FIG. 2.

Figure 2:
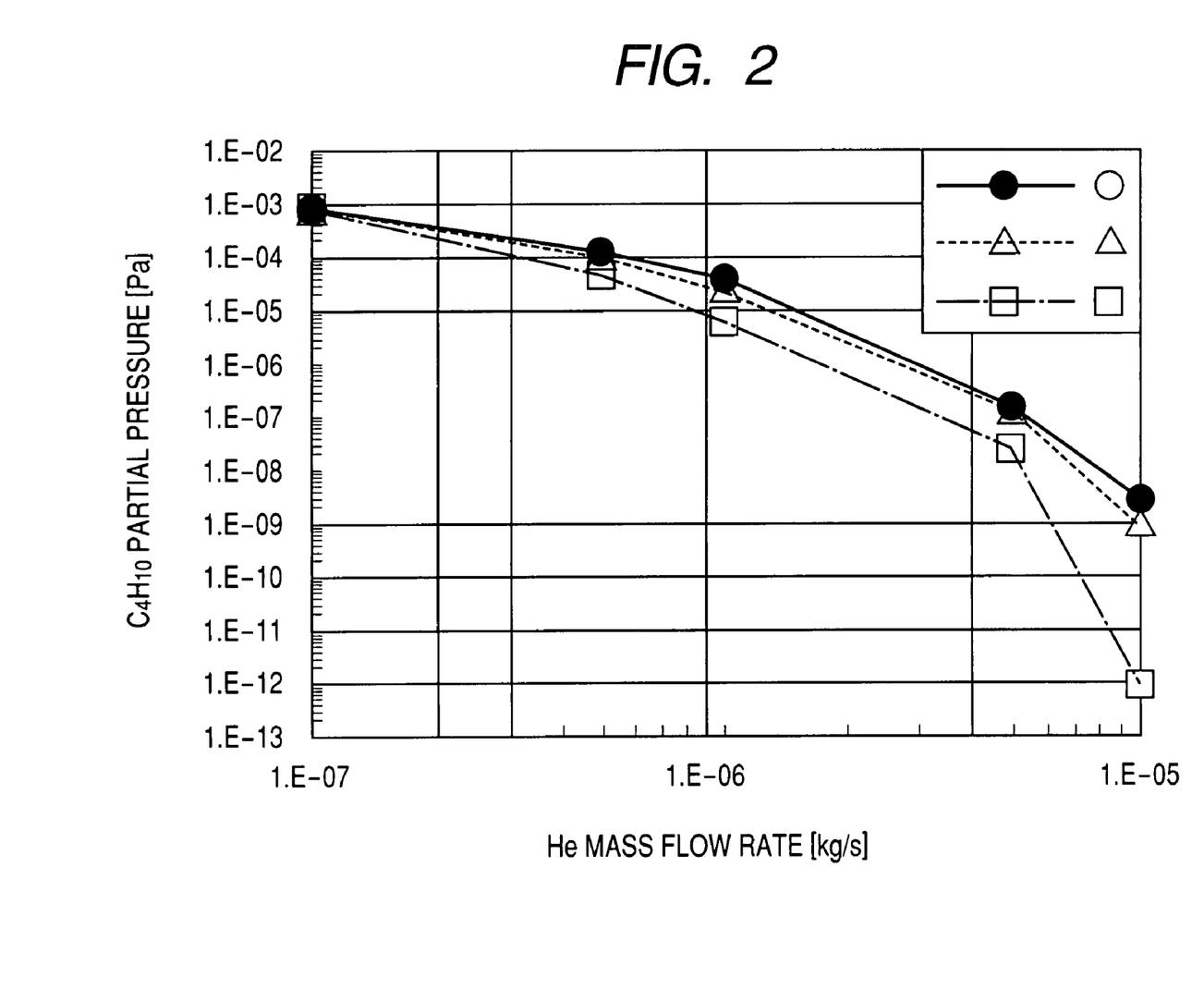
FIG. 2 shows the transition of the partial pressure of hydrocarbon in the first embodiment.

The axis of abscissas in FIG. 2 indicates the amount of helium supply (He mass flow rate), and the axis of ordinates indicates the partial pressure of the out gas produced from the resist in the second projection system space 63. The mark ○ indicates the result of the case where helium was supplied, the mark A indicates the result of the case where helium was supplied and the conductance of the orifice member 52 was set to a lower value than that of the wafer stage space opening portion 53, and the mark □ indicates the result of the case where the conductance of the orifice member 52 was set to an infinitely low value. Also, the partial pressure of the out gas when helium was not supplied was about $1 \times 10^{-3}$ Pa.

From these results, it will be seen that by supplying helium to the second projection system space, it is possible to pervert the out gas produced from the resist from entering the second projection system space and further, by setting the conductance of the orifice member 52 to a lower value than that of the wafer stage space opening portion 53, it is possible to more enhance the deterring effect.

Also, by providing the orifice member 52, it is possible to suppress the outflow rate of helium to the first projection system space 62 and therefore, it is possible to suppress the amount of consumption of expensive helium. Further, by providing this orifice member 52, it becomes possible to lower the partial pressure of helium in the first projection system space 62 and therefore, the transmittance of the EUV light, which is also absorbed by helium, can be kept high, and an improvement in throughput can be achieved.

Also, it is preferable that the exhaust speed of the turbo-molecular pump or the like mounted in the second projection system space 63 be set to a lower value than the exhaust speeds of the first projection system space 62 and the wafer stage space 64 in order to keep the pressure in the second projection system space 63 higher than the pressure in the first projection system space 62 and the wafer stage space 64.

Also, of the helium supplied to the second projection system space 63, the flow out rate into the wafer stage space 64 through the wafer stage space opening portion is made greater than the flow out rate into the reticle stage space 61 through the orifice member 51, whereby it is effectively possible to prevent the out gas produced from the resist from entering the second projection system space 63.

Here, among the reticle stage space, the first projection system space, the second projection system space and the wafer stage space, it is preferable that the pressure in the second projection system space, which is nearest to the wafer stage space, be made highest. Describing in more detail, it is preferable that the pressure in the first projection system space be the second highest, and it is desirable that the pressure in the reticle stage space be the third highest and the pressure in the wafer stage space be lowest. Of course, this is not restrictive, but the pressure in the first projection system space may be made highest. It is desirable at least that the pressure in the first projection system space and the second projection system space are higher than the pressure in the reticle stage space and the wafer stage space.

Also, in this first embodiment, the space containing therein the optical element, which the projection optical system has, is divided into two spaces, i.e., the first projection system space and the second projection system space, whereas this is not restrictive, but the aforementioned space may be divided into three or more spaces. Even in that case, it is desirable that the pressure in the space nearest to the wafer stage space be made highest, and further, it is desirable that the pressure in all of the spaces in the projection optical system exceeds the pressure in the reticle stage space and the wafer stage space.

Also, it is desirable that the pressure in all the spaces on the optical path of the EUV light, including the reticle stage space, the first projection system space, the second projection system space and the wafer stage space be 100 Pa or less, and preferably 10 Pa or less.

Second Embodiment

Figure 3:
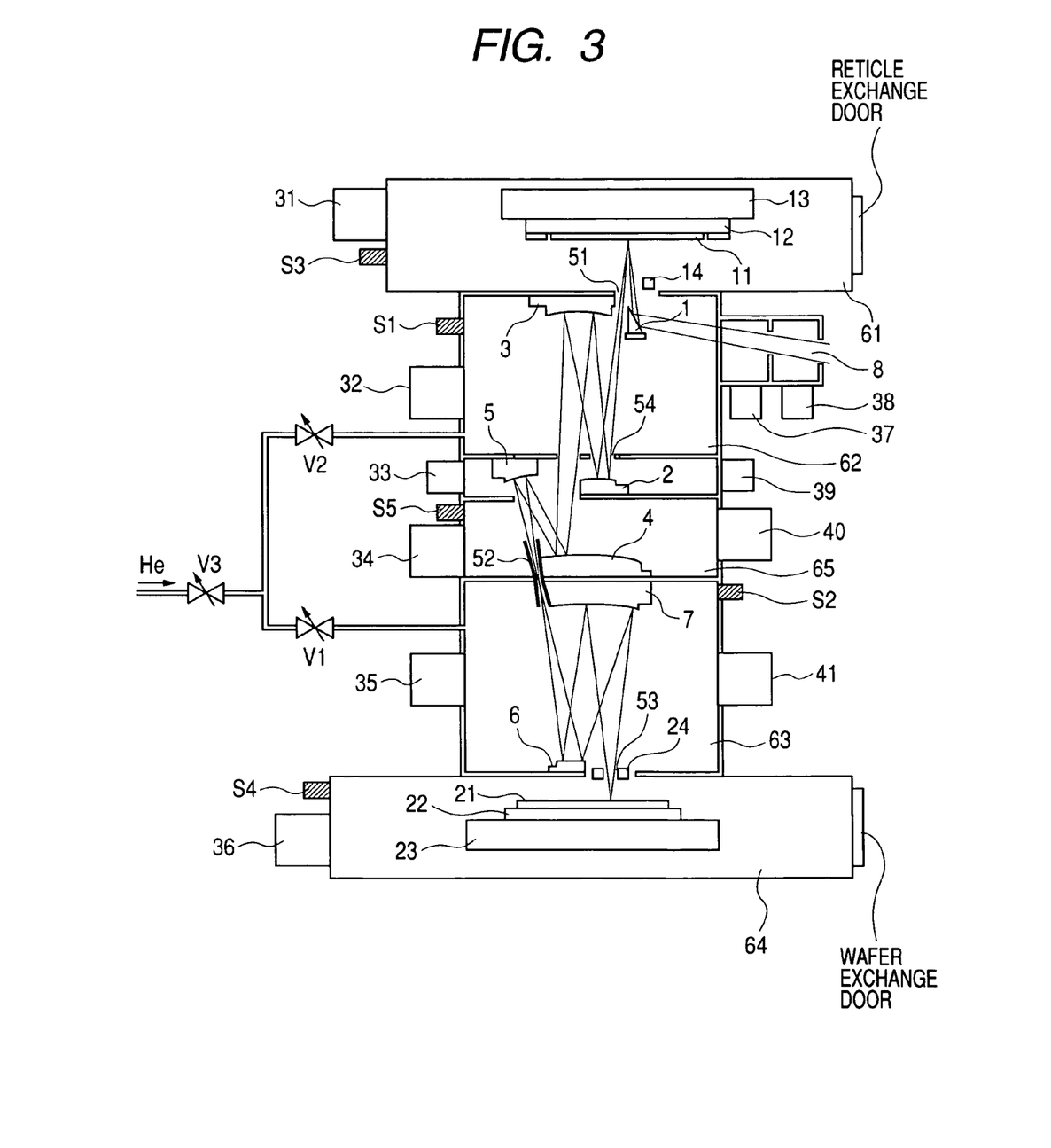
FIG. 3 is a schematic view of an exposing apparatus according to a second embodiment of the present invention.

FIG. 3 shows the configuration of the second embodiment.

The projection system space disposed between the reticle stage space 61 and the wafer stage space 64 has an opening portion 54 and an orifice member 52, and is composed of a first projection system space 62, a second projection system space 63 and a third projection system space 65.

The previous embodiment is a case where an inert gas is supplied only to the second projection system space 63, however in the present embodiment, piping branches off from a valve V3 for supplying the inert gas, and a valve V1 for supplying the inert gas to the second projection system space 63 and a valve 2 for supplying the inert gas to the first projection system space 62 are configured. The valves V1, V2 and V3 can control the gas supply rate in conformity with the pressure in the spaces to which the inert gas is to be supplied.

The pressure in the first projection system space 62 is kept at predetermined pressure by a turbo-molecular pump 32 connected thereto and a pressure sensor S1. Also, the first projection system space 62 configures a multi-stage differential exhaust system by turbo-molecular pumps 37 and 38 in a portion on which EUV light is incident from an EUV light source, not shown.

The pressure in the third projection system space 65 is kept at predetermined pressure by turbo-molecular pumps 33, 34, 39 and 40 connected thereto and a pressure sensor S5.

The pressure in the second projection system space 63 is also kept at predetermined pressure by turbo-molecular pumps 35 and 41 connected thereto and a pressure sensor S2.

In the first embodiment, helium is supplied to the second projection system space 63 by the utilization of the valve V1, whereby the out gas produced from the resist during exposure can be effectively prevented from entering the second projection system space 63. Also, for the out gas produced from the reticle stage space 61, a differential exhaust system is configured.

However, if there is at least one space between the space (the second projection system space 63) supplied with helium and the space (the first projection system space 62) adjacent to the reticle stage space as in a case of this second embodiment, it is also conceivable to configure a multi-stage differential exhaust system in order to deter the out gas produced from the reticle stage space 61 from entering the first projection system space 62, however, it may contain spatial difficulty.

So, helium is supplied to the first projection system space 62 and the second projection system space 63 by the use of the valves V1, V2 and V3. That is, the configuration is made such that helium is supplied to the space adjacent to the reticle stage space and to the space adjacent to the wafer stage space. The helium supplied to the second projection system space 63 flows as described in the first embodiment, and the helium supplied to the first projection system space 62 fills the first projection system space, and flows into the third projection system space 65 through the opening portion 54, and further flows into the reticle stage space 61 through the reticle stage space opening portion 51.

At this time, the pressure in the first projection system space 62 is kept at about 1 to 10 Pa, and the pressure in the third projection system space 65 and the reticle stage space 61 is kept below it, whereby it is possible to deter the out gas produced from the reticle stage space from entering the first projection system space 62.

Further, when helium is supplied into the first projection system space 62, the conductance of the opening portion 54 is set to a lower value than that of the reticle stage space opening portion 51, whereby the out gas produced from the reticle stage space can be better deterred from entering the first projection system space 62.

Also, by providing the stop portion 52 and the opening portion 54, it is possible to lower the partial pressure of the helium in the projection system space 65, and it is possible to keep the transmittance of exposure light high and it is also possible to suppress the amount of consumption of helium supplied.

Also, it is desirable that the exhaust speed of the turbo-molecular pumps, etc., mounted in the first projection system space 62 and the second projection system space 63 be set to a lower level than the exhaust speeds of the third projection system space 65, the wafer stage space 64 and the reticle stage space 61 in order to keep the pressure in the first projection system space 62 and the second projection system space 63 higher than the pressure in the third projection system space 65, the wafer stage space 64 and the reticle stage space 61.

Also, of the helium supplied to the first projection system space 62, the flow out rate into the wafer stage space is made greater than the flow out rate from the reticle stage space opening portion 51, or is made greater than the flow out rate from the orifice member 52 into the third projection system space, whereby the out gas produced from the resist can be effectively deterred from entering the second projection system space 63.

While the first and second embodiments have been described above, the present invention is not restricted thereto.

In the exposing apparatus in the present embodiment, the pressure in the wafer stage space is made lower than the pressure in the space (the second projection system space) of the projection optical system which is adjacent to the wafer stage space.

Further, the configuration is made such that the inert gas flow out rate from the second projection system space into the wafer stage space becomes greater than the inert gas flow out rate from the second projection system space into the space (in the first embodiment, the first projection system space, and in the second embodiment, the third projection system space) adjacent to the second projection system space on the reticle side.

Furthermore, the configuration is made such that among the reticle stage space, the wafer stage space and at least one space (preferably a plurality of spaces) containing the optical element of the projection optical system therein, the pressure in the space containing the optical element of the projection optical system and adjacent to the wafer stage space is made highest.

Still furthermore, it is preferable that the configuration be made such that the volume of the space (in the first and second embodiments, the second projection system space) adjacent to the wafer stage space is less than a half, preferably one-third or less, of the volume of the entire space containing the optical element of the projection optical system therein.

Also, while in the above-described embodiments, helium is supplied, this is not restrictive, however, and other inert gas such as nitrogen or argon may be used. Also, while in the above-described embodiments, a valve is provided so that the helium mass flow rate may be adjustable, the configuration may be made such that helium is always supplied at a constant flow rate.

Also, it is desirable that among the wafer stage space, the reticle stage space, the space (the second projection system space in the first and second embodiments) adjacent to the wafer stage, and the stage (the first projection system space in the first and second embodiments) adjacent to the reticle stage, the space adjacent to the wafer stage be lowest in the exhaust speed at which the gas in the respective space is exhausted, and that the space adjacent to the reticle stage be second lowest in this exhaust speed. The lowest and the second lowest may be converse.

Also, in the second embodiment, the third projection system space is not limited to one space, but may be constituted by a plurality of spaces capable of being communicated with one another.

Also, when according to such embodiments as described above, the inert gas is supplied into the projection optical system space to thereby deter the out gas from the wafer stage space from entering the projection optical system space, it is possible to dispose an orifice member for generating differential pressure in the projection optical system space to thereby deter the out gas more effectively.

Also, the pressure rise in the projection optical system space by the supply of the inert gas can be partly restricted and therefore, it is possible to suppress the lowering of the transmittance of the EUV light and keep a high throughput.

Also, the above-described first and second embodiments may be arbitrarily combined together within a scope free of contradiction.

Third Embodiment

A third embodiment, which is a device manufacturing method utilizing the above-described exposing apparatus, is described with reference to FIGS. 5 and 6.

Figure 5:
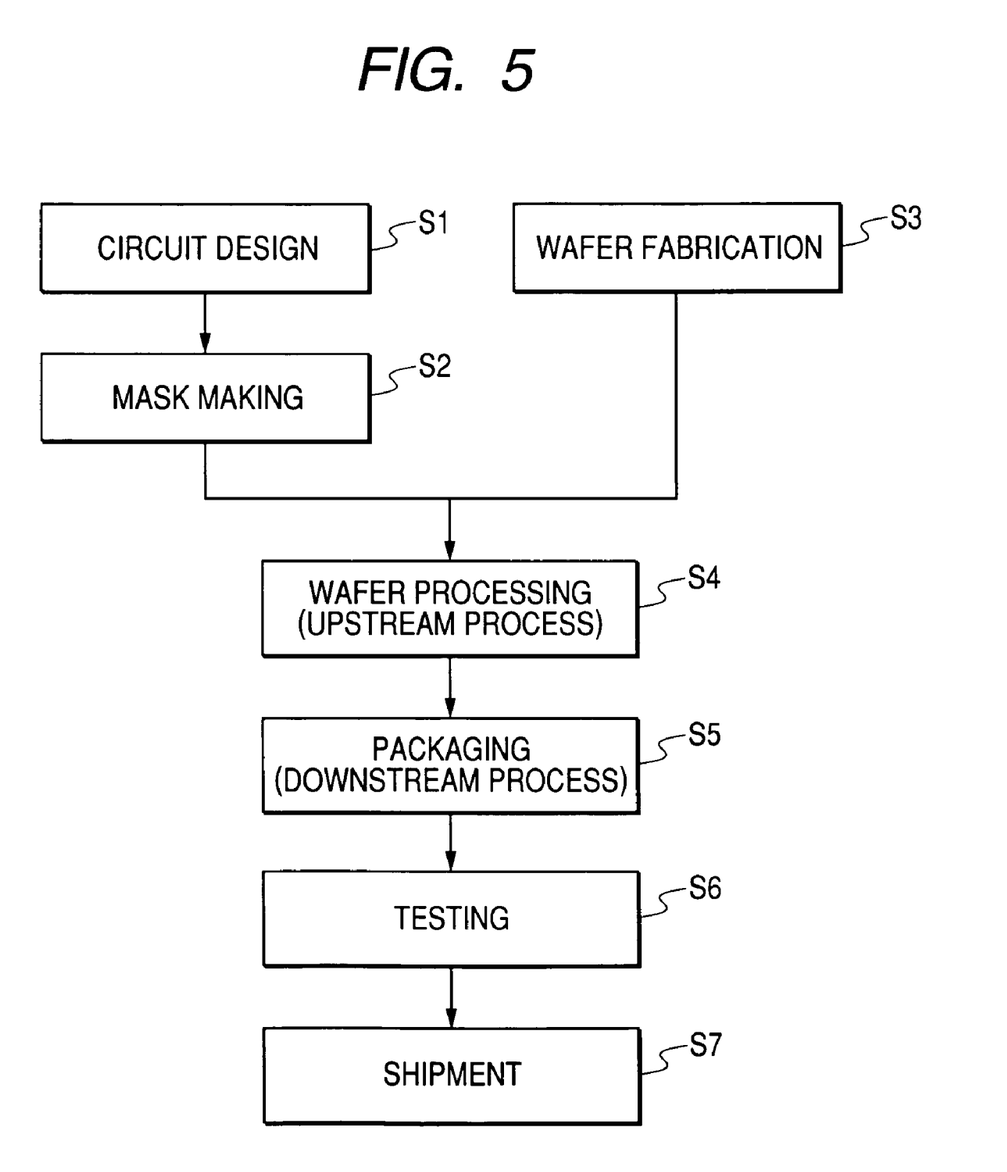
FIG. 5 is a flow chart for illustrating the manufacture of a device (a semiconductor chip such as IC or LSI, an LCD, a CCD or the like).

FIG. 5 is a flow chart for illustrating the manufacture of a device (a semiconductor chip such as IC or LSI, an LCD, a CCD or the like). In the present embodiment, the manufacture of a semiconductor chip will be described as an example. In step 1 (circuit design), the circuit design of a device is done. In step 2 (mask making), a mask formed with a designed circuit pattern is fabricated. In step 3 (wafer fabrication), a wafer is fabricated from material such as silicon. Step 4 (wafer processing) is called an upstream process, and forms an actual circuit on the wafer by lithography technique by the use of the mask and the wafer. Step 5 (packaging) is called a downstream process, and is the step of making a semiconductor chip by the use of the wafer prepared in the step 4, and includes such steps as an assembly step (dicing and bonding), a packaging step (chip enveloping), etc. In step 6 (testing), such tests as the operation confirming test and durability tests of the semiconductor device prepared in the step 5, are carried out. The semiconductor device is completed via such steps, and it is shipped (step 7).

Figure 6:
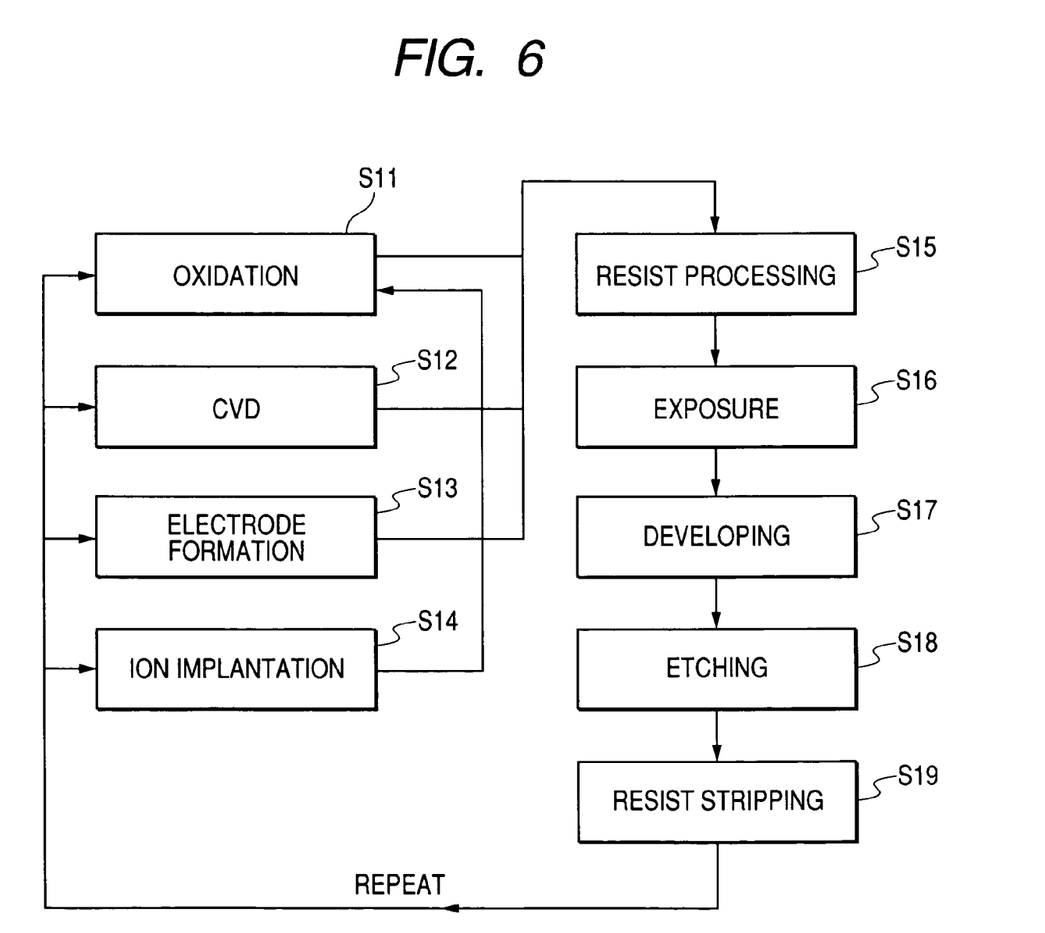
FIG. 6 is a detailed flow chart of the wafer processing of a step 4 shown in FIG. 5.

FIG. 6 is a detailed flow chart of the wafer processing of the step 4. In step 11 (oxidation), the surface of the wafer is oxidated. In step 12 (CVD), insulating film is formed on the surface of the wafer. In step 13 (electrode formation), an electrode is formed on the wafer by vapor deposition or the like. In step 14 (ion implantation), ions are implanted into the wafer. In step 15 (resist processing), a sensitizer is applied to the wafer. In step 16 (exposure), the wafer is exposed to the circuit pattern of the mask by the above-described exposing apparatus. In step 17 (developing), the exposed wafer is developed. In step 18 (etching), the other portion than the developed resist image is shaved off. In step 19 (resist stripping), the resist, which has become unnecessary after etching, is removed. These steps are repetitively executed, whereby a multiple circuit pattern is formed on the wafer. According to the device manufacturing method of the present embodiment, a device with higher quality than heretofore can be manufactured. Thus, the device manufacturing method using the exposing apparatus, and the device as a result thereof also constitute a side of the present invention.

While the preferred embodiments of the present invention have been described above, the present invention permits the first, second and third embodiments to be arbitrarily combined together.

The mass flow rate of out gas entering the projection optical system from the wafer stage space can be decreased and therefore, the optical element, which the projection optical system has, becomes difficult to be contaminated. As the result, the frequency of the maintenance of the exposing apparatus can be reduced and therefore, the throughput of the exposing apparatus can be improved.

Fourth Embodiment

Figure 7:
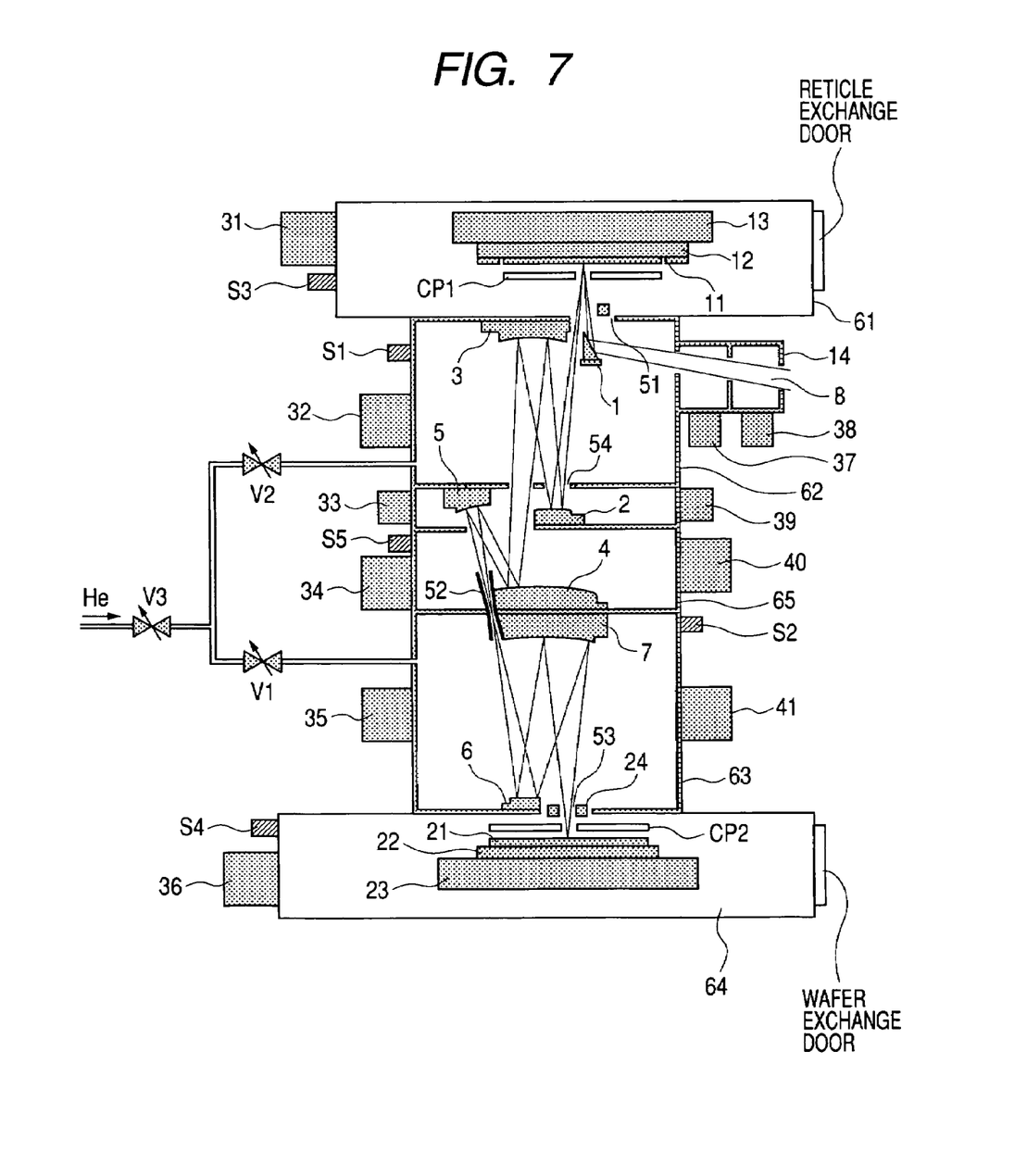
FIG. 7 is a schematic view of an EUV exposing apparatus according to a fourth embodiment of the present invention.

An EUV exposing apparatus as a side of the present invention will hereinafter be described with reference to FIG. 7. The configurational differences between this EUV exposing apparatus and the aforedescribed embodiments will first be described. FIG. 7 is a block diagram showing the configuration of the exposing apparatus. In the previous embodiments, description has been made of a method for preventing contamination present in the reticle stage space and the wafer stage space from entering the projection optical system space. In the present embodiment, description will be made of a method for suppressing the adherence of particles present in the stage spaces and the projection optical system space to the surface of the reticle and the surface of the wafer.

Cooling members CP1 and CP2 are provided near a reticle stage space opening portion 51 and a wafer stage space opening portion 53, respectively, shown in FIG. 7. CP1 and CP2 are members having a cooling mechanism connected thereto, and are disposed at locations opposed to the surface of the reticle or the surface of the wafer. Each connected member has a pipe for cooling wafer or a Peltier element or the like connected thereto as a cooling mechanism, not shown, and is cooled at a constant temperature. The areas of the surface of the wafer and the surface of the reticle, to which exposure light is applied, rise in temperature by the heat of the exposure light, and the temperature becomes higher than that of the cooling members CP1 and CP2. Therefore, during exposure, a temperature difference occurs between the cooling members CP1, CP2 and the surface of the reticle, the surface of the wafer. Also, usually the reticle and the wafer are controlled so that the temperature thereof may become constant and therefore, it is also possible to control the temperature of the surfaces of the reticle and the wafer by the cooling members CP1 and CP2. Also, the reticle and the wafer may be individually temperature-controlled, and relative to the set temperature thereof, the temperature of the cooling members CP1 and CP2 may be set to a low temperature.

Also, an inert gas such as He, which is high in transmittance of EUV light, or hydrogen is supplied through valves V1 and V2. To obtain the effect of thermophoresis for suppressing particles, it is preferable to set the pressure in a reticle stage space 61 and a wafer stage space 64 to at least 5 Pa or greater.

By so setting, it is possible to suppress the adherence of the particles to the surface of the reticle and the surface of the wafer by thermophoresis.

While in the present embodiment, there has been shown a configuration which obtains the particle suppressing effect for both of the wafer and the reticle, it is possible to carry out this for at least one of them to thereby obtain an improvement in productivity.

According to the present invention, there can be provided an exposing apparatus which simply achieves improvements in productivity such as the yield of the manufacture of a device and the reliability of the device.

The practice modes of the present invention will hereinafter be enumerated.

(Practice Mode 1)

An exposing apparatus having a projection optical system having a plurality of optical elements and for directing light from a reticle to a member to be exposed, a wafer stage on which the member to be exposed is placed, and a wafer stage space surrounding the wafer stage, the exposing apparatus having:
    a wafer side projection system space containing at least one of the plurality of optical elements therein, adjacent to the wafer stage space, and communicating with the wafer stage space through a wafer stage opening;
    wherein pressure in the wafer side projection system space is higher than pressure in the wafer stage space.

(Practice Mode 2)

An exposing apparatus according to Practice Mode 1, further having wafer side projection system space exhaust means for exhausting gas in the wafer side projection system space, and wafer stage space exhaust means for exhausting gas in the wafer stage space, and wherein an exhaust speed by the wafer side projection system space exhaust means is lower than an exhaust speed by the wafer stage space exhaust means.

(Practice Mode 3)

An exposing apparatus having a projection optical system having a plurality of optical elements, and for directing light from a reticle to a member to be exposed, a wafer stage on which the member to be exposed is placed, and a wafer stage space surrounding the wafer stage, the exposing apparatus having:
    a wafer side projection system space containing at least one of the plurality of optical elements therein, adjacent to the wafer stage space, and communicating with the wafer stage space through a wafer stage opening, wafer side projection system space exhaust means for exhausting gas in the wafer side projection system space, and wafer stage space exhaust means for exhausting gas in the wafer stage space;
    wherein an exhaust speed by the wafer side projection system space exhaust means is lower than an exhaust speed by the wafer stage space exhaust means.

(Practice Mode 4)

An exposing apparatus according to any one of Practice Modes 1 to 3, further having an intermediate projection system space containing another one of the plurality of optical elements therein, adjacent to the wafer side projection system space, and communicating with the wafer side projection system space through a wafer side opening, and wherein pressure in the wafer side projection system space is higher than pressure in the intermediate projection system space.

(Practice Mode 5)

An exposing apparatus having a projection optical system having a plurality of optical elements, and for directing light from a reticle to a member to be exposed, a wafer stage on which the member to be exposed is placed, and a wafer stage space surrounding the wafer stage, the exposing apparatus having:

a wafer side projection system space containing at least one of the plurality of optical elements therein, adjacent to the wafer stage space, and communicating with the wafer stage space through a wafer stage opening; and an intermediate projection system space containing at least one of the plurality of optical elements therein, adjacent to the wafer side projection system space, and communicating with the wafer side projection system space through a wafer side opening;

wherein a gas flow rate from the wafer side projection system space into the wafer stage space is greater than a gas flow rate from the wafer side projection system space into the intermediate projection system space.

(Practice Mode 6)

An exposing apparatus having a projection optical system having a plurality of optical elements, and for directing light from a reticle to a member to be exposed, a wafer stage on which the member to be exposed is place, and a wafer stage space surrounding the wafer stage, the exposing apparatus having:

a wafer side projection system space containing at least one of the plurality of optical elements therein, adjacent to the wafer stage space, and communicating with the wafer stage space through a wafer stage opening; and an intermediate projection system space containing at least one of the plurality of optical elements therein, adjacent to the wafer side projection system space, and communicating with the wafer side projection system space through a wafer side opening;

wherein the conductance of a communicating portion between the wafer side projection system space and the wafer stage space is greater than the conductance of a communicating portion between the wafer side projection system space and the intermediate projection system space.

(Practice Mode 7)

An exposing apparatus according to Practice Mode 6, wherein a gas flow rate from the wafer side projection system space into the wafer stage space is greater than a gas flow rate from the wafer side projection system space into the intermediate projection system space.

(Practice Mode 8)

An exposing apparatus according to any one of Practice Modes 5 to 8, wherein pressure in the wafer side projection system space is higher than pressure in the wafer stage space.

(Practice Mode 9)

An exposing apparatus according to any one of Practice Modes 4 to 8, further having wafer side projection system space exhaust means for exhausting gas in the wafer side projection system space, wafer stage space exhaust means for exhausting gas in the wafer stage space, and intermediate projection system space exhaust means for exhausting gas in the intermediate projection system space, and wherein an exhaust speed by the wafer side projection system space exhaust means is lower than an exhaust speed by the wafer stage space exhaust means and an exhaust speed by the intermediate projection system space exhaust means.

(Practice Mode 10)

An exposing apparatus according to Practice Mode 9, wherein the exhaust speed by the wafer stage space exhaust means is made higher than the exhaust speed by the intermediate projection system space exhaust means.

(Practice Mode 11)

An exposing apparatus according to any one of Practice Modes 4 to 10, further having a reticle stage on which the reticle is placed, a reticle stage space surrounding the reticle stage, and a reticle side projection system space containing at least one of the plurality of optical elements therein, adjacent to the reticle stage space, and communicating with the reticle stage space through a reticle stage opening, and wherein the intermediate projection system space contains at least one of the plurality of optical elements, is adjacent to the reticle side projection system space, and communicates with the reticle side projection system space through a reticle side opening, and pressure in the reticle side projection system space is higher than pressure in the reticle stage space and pressure in the intermediate projection system space.

(Practice Mode 12)

An exposing apparatus according to any one of Practice Modes 4 to 11, further having a reticle stage on which the member to be exposed is placed, a reticle stage space surrounding the reticle stage, and a reticle side projection system space containing at least one of the plurality of optical elements, adjacent to the reticle stage space, and communicating with the reticle stage space through a reticle stage opening, and wherein the intermediate projection system space contains at least one of the plurality of optical elements therein, is adjacent to the reticle side projection system space, and communicates with the reticle side projection system space through a reticle side opening, and a gas flow rate from the reticle side projection system space into the reticle stage space is greater than the gas flow rate from the reticle side projection system space into the intermediate projection system space.

(Practice Mode 13)

An exposing apparatus according to any one of Practice Modes 4 to 12, further having a reticle stage on which the member to be exposed is placed, a reticle stage space surrounding the reticle stage, and a reticle side projection system space containing at least one of the plurality of optical elements therein, adjacent to the reticle stage space, and communicating with the reticle stage space through a reticle stage opening, and wherein the intermediate projection system space contains at least one of the plurality of optical elements therein, is adjacent to the reticle side projection system space, and communicates with the reticle side projection system space through a reticle side opening, and the conductance of a communicating portion between the reticle side projection system space and the reticle stage space is greater than the conductance of a communicating portion between the reticle side projection system space and the intermediate projection system space.

(Practice Mode 14)

An exposing apparatus according to any one of Practice Modes 11 to 13, further having reticle stage space exhaust means for exhausting gas in the reticle stage space, reticle side projection system space exhaust means for exhausting gas in the reticle side projection system space, intermediate projection system space exhaust means for exhausting gas in the intermediate projection system space, wafer side projection system space exhaust means for exhausting gas in the wafer side projection system space, and wafer stage space exhaust means for exhausting gas in the wafer stage space, and wherein among the reticle stage space exhaust means, the reticle side projection system space exhaust means, the intermediate projection system space exhaust means, the wafer side projection system space exhaust means and the wafer stage space exhaust means, the exhaust speed of the wafer side projection system space exhaust means is lowest.

(Practice Mode 15)

An exposing apparatus according to any one of Practice Modes 11 to 14, further having reticle stage space exhaust means for exhausting gas in the reticle stage space, reticle side projection system space exhaust means for exhausting gas in the reticle side projection system space, intermediate projection system space exhaust means for exhausting gas in the intermediate projection system space, wafer side projection system space exhaust means for exhausting gas in the wafer side projection system space, and wafer stage space exhaust means for exhausting gas in the wafer stage space, and wherein the exhaust speed of the wafer side projection system space exhaust means is lower than the exhaust speeds of the intermediate projection system space exhaust means and the wafer stage space exhaust means, and the exhaust speed of the reticle side projection system space exhaust means is lower than the exhaust speed of the reticle stage space exhaust means and the exhaust speed of the intermediate projection system space exhaust means.

(Practice Mode 16)

An exposing apparatus according to any one of Practice Modes 11 to 15, wherein pressure in the wafer stage space is lower than pressure in the reticle stage space.

(Practice Mode 17)

An exposing apparatus according to any one of Practice Modes 1 to 16, further having an orifice member disposed in a communicating portion between the wafer stage space and the wafer side projection system space.

(Practice Mode 18)

An exposing apparatus according to any one of Practice Modes 1 to 17, further having gas-feeding means for supplying inert gas to the wafer side projection system space.

(Practice Mode 19)

An exposing apparatus according to Practice Mode 18, wherein the inert gas is one of helium and argon.

(Practice Mode 20)

An exposing apparatus according to Practice Mode 18 or 19, further having means for measuring the flow rate of the inert gas supplied by the gas supplying means, and wherein the frown rate of inert gas is controlled in conformity with the pressure in the wafer side projection system space.

(Practice Mode 21)

An exposing apparatus having a projection optical system having a plurality of optical elements, and for directing light from a reticle to a member to be exposed, a reticle stage on which the reticle is placed, and a reticle stage space surrounding the reticle stage, the exposing apparatus having:

a reticle side projection system space containing at least one of the plurality of optical elements therein, adjacent to the reticle stage space, and communicating with the reticle stage space through a reticle stage opening;

wherein pressure in the reticle side projection system space is higher than pressure in the reticle stage space.

(Practice Mode 22)

An exposing apparatus according to Practice Mode 21, further having reticle side projection system space exhaust means for exhausting gas in the reticle side projection system space, and reticle stage space exhaust means for exhausting gas in the reticle stage space, and wherein an exhaust speed by the reticle side projection system space exhaust means is lower than an exhaust speed by the reticle stage space exhaust means.

(Practice Mode 23)

An exposing apparatus having a projection optical system having a plurality of optical elements, and for directing light from a reticle to a member to be exposed, a reticle stage on which the reticle is placed, and a reticle stage space surrounding the reticle stage, the exposing apparatus having:

a reticle side projection system space containing at least one of the plurality of optical elements therein, adjacent to the reticle stage space, and communicating with the reticle stage space through a reticle stage opening;

wherein an exhaust speed by reticle side projection system space exhaust means is lower than an exhaust speed by reticle stage space exhaust means.

(Practice Mode 24)

An exposing apparatus according to any one of Practice Modes 21 to 23, further having an intermediate projection system space containing at least one of the plurality of optical elements therein, adjacent to the reticle side projection system space, and communicating with the reticle side projection system space through a reticle side opening, and wherein pressure in the reticle side projection system space is higher than pressure in the intermediate projection system space.

(Practice Mode 25)

An exposing apparatus having a projection optical system having a plurality of optical elements, and for directing light from a reticle to a member to be exposed, a reticle stage on which the member to be exposed is placed, and a reticle stage space surrounding the reticle stage, the exposing apparatus having:

a reticle side projection system space containing at least one of the plurality of optical elements therein, adjacent to the reticle stage space, and communicating with the reticle stage space through a reticle stage opening; and an intermediate projection system space containing at least one of the plurality of optical elements therein, adjacent to the reticle side projection system space, and communicating with the reticle side projection system space through a reticle side opening;

wherein a gas flow rate from the reticle side projection system space into the reticle stage space is greater than a gas flow rate from the reticle side projection system space into the intermediate projection system space.

(Practice Mode 26)

An exposing apparatus having a projection optical system having a plurality of optical elements, and for directing light from a reticle to a member to be exposed, a reticle stage on which the member to be exposed is placed, and a reticle stage space surrounding the reticle stage, the exposing apparatus having:

a reticle side projection system space containing at least one of the plurality of optical elements therein, adjacent to the reticle stage space, and communicating with the reticle stage space through a reticle stage opening; and an intermediate projection system space containing at least one of the plurality of optical elements therein, adjacent to the reticle side projection system space, and communicating with the reticle side projection system space through a reticle side opening;

wherein the conductance of a communicating portion between the reticle side projection system space and the reticle stage space is greater than the conductance of a communicating portion between the reticle side projection system space and the intermediate projection system space.

(Practice Mode 27)

An exposing apparatus according to any one of Practice Modes 4 to 6 and 24 to 26, wherein the intermediate projection system space includes a plurality of spaces capable of communicating with one another.

(Practice Mode 28)

An exposing apparatus according to any one of Practice Modes 1 to 27, wherein all of the plurality of optical elements are reflecting optical elements.

(Practice Mode 29)

An exposing apparatus according to any one of Practice Modes 1 to 28, wherein the wavelength of the light used in the exposing apparatus is between 0.1 nm to 30 nm.

(Practice Mode 30)

A method of device manufacturing having a step of exposing the member to be exposed by the use of an exposing apparatus according to any one of Practice Modes 1 to 29, and a step of developing the exposed member to be exposed.

The present invention is not restricted to the above embodiments and various changes and modifications can be made within the spirit and scope of the present invention. Therefore, to apprise the public of the scope of the present invention, the following claims are made.

This application claims priority from Japanese Patent Application No. 2003-337562, entitled "Manufacture method of exposure apparatus and device" and filed on Sep. 29, 2003, and Japanese Patent Application No. 2004-242229, entitled "Manufacture method of exposure apparatus and device" and filed on Aug. 23, 2004, the entire contents of which are incorporated herein by reference.

What is claimed is:

1. An exposure apparatus comprising:
   a projection optical system which has a plurality of optical elements, and directs light from an original to an object to be exposed;
   a first stage which holds the object to be exposed;
   a first vacuum chamber which contains said first stage;
   a second vacuum chamber which is adjacent to said first vacuum chamber, contains a part of said plurality of optical elements, and communicates with said first vacuum chamber through a first opening, wherein pressure in said second vacuum chamber is higher than pressure in said first vacuum chamber; and
   a third vacuum chamber adjacent to said second vacuum chamber, the third vacuum chamber including another one of said plurality of optical elements and communicates with said second vacuum chamber through a second opening, wherein the pressure in said second vacuum chamber is higher than pressure in said third vacuum chamber.

2. An apparatus according to claim 1, further comprising:
   a first exhaust unit which exhausts gas in said first vacuum chamber; and
   a second exhaust unit which exhausts gas in said second vacuum chamber,
   wherein an exhaust rate by said second exhaust unit is lower than an exhaust rate by said first exhaust unit.

3. An apparatus according to claim 2, wherein all of said plurality of optical elements are reflecting optical elements.

4. An apparatus according to claim 2, wherein a wavelength of the light is between 0.1 nm to 30 nm.

5. An apparatus according to claim 1, wherein a gas flow rate from said second vacuum chamber into said first vacuum chamber is greater than a gas flow rate from said second vacuum chamber into said third vacuum chamber.

6. An apparatus according to claim 5, wherein conductance of a communicating portion between said second vacuum chamber and said first vacuum chamber is greater than conductance of a communicating portion between said second vacuum chamber and said third vacuum chamber.

7. An apparatus according to claim 6, wherein all of said plurality of optical elements are reflecting optical elements.

8. An apparatus according to claim 6, wherein a wavelength of the light is between 0.1 nm to 30 nm.

9. An apparatus according to claim 6, wherein all of said plurality of optical elements are reflecting optical elements.

10. An apparatus according to claim 5, wherein a wavelength of the light is between 0.1 nm to 30 nm.

11. An apparatus according to claim 1, further comprising:
    a first exhaust unit which exhausts gas in said first vacuum chamber;
    a second exhaust unit which exhausts gas in said second vacuum chamber; and
    a third exhaust unit for exhausting gas in said third vacuum chamber,
    wherein an exhaust rate by said second exhaust unit is lower than an exhaust rate by said first exhaust unit and an exhaust rate by said third exhaust unit.

12. An apparatus according to claim 11, wherein the exhaust rate by said first exhaust unit is higher than the exhaust rate by said third exhaust unit.

13. An apparatus according to claim 12, wherein all of said plurality of optical elements are reflecting optical elements.

14. An apparatus according to claim 12, wherein a wavelength of the light is between 0.1 nm to 30 nm.

15. An apparatus according to claim 11, wherein all of said plurality of optical elements are reflecting optical elements.

16. An apparatus according to claim 11, wherein a wavelength of the light is between 0.1 nm to 30 nm.

17. An apparatus according to claim 1, further comprising:
    a second stage which holds the original;
    a fourth vacuum chamber containing said second stage therein; and
    a fifth vacuum chamber which is adjacent to said fourth vacuum chamber, contains a part of said plurality of optical elements, and communicates with said fourth vacuum chamber through a third opening,
    wherein said third vacuum chamber is adjacent to said fifth vacuum chamber, and communicates with said fifth vacuum chamber through a fourth opening, and pressure in said fifth vacuum chamber is higher than pressure in said fourth vacuum chamber and pressure in said third vacuum chamber.

18. An apparatus according to claim 17, wherein a gas flow rate from said fifth vacuum chamber into said fourth vacuum chamber is greater than a gas flow rate from said fifth vacuum chamber into said third vacuum chamber.

19. An apparatus according to claim 18, wherein conductance of a communicating portion between said fifth vacuum chamber and said fourth vacuum chamber is greater than conductance of a communicating portion between said fifth vacuum chamber and said third vacuum chamber.

20. An apparatus according to claim 19, wherein all of said plurality of optical elements are reflecting optical elements.

21. An apparatus according to claim 19, wherein a wavelength of the light is between 0.1 nm to 30 nm.

22. An apparatus according to claim 18, wherein all of said plurality of optical elements are reflecting optical elements.

23. An apparatus according to claim 18, wherein a wavelength of the light is between 0.1 nm to 30 nm.

24. An apparatus according to claim 17, further comprising:
- a first exhaust unit which exhausts gas in said first vacuum chamber;
- a second exhaust unit which exhausts gas in said second vacuum chamber;
- a third exhaust unit which exhausts gas in said third vacuum chamber;
- a fourth exhaust unit which exhausts gas in said fourth vacuum chamber; and
- a fifth exhaust unit which exhausts gas in said fifth vacuum chamber,
- wherein an exhaust rate by said second exhaust unit is lowest among exhaust rates of said first to fifth exhaust units.

25. An apparatus according to claim 24, wherein all of said plurality of optical elements are reflecting optical elements.

26. An apparatus according to claim 24, wherein a wavelength of the light is between 0.1 nm to 30 nm.

27. An apparatus according to claim 17, further comprising:
- a first exhaust unit which exhausts gas in said first vacuum chamber;
- a second exhaust unit which exhausts gas in said second vacuum chamber;
- a third exhaust unit which exhausts gas in said third vacuum chamber;
- a fourth exhaust unit which exhausts gas in said fourth vacuum chamber; and
- a fifth exhaust unit which exhausts gas in said fifth vacuum chamber,
- wherein an exhaust rate by said second exhaust unit is lower than an exhaust rate by said first exhaust unit and an exhaust rate by said third exhaust unit, and an exhaust rate by said fifth exhaust unit is lower than the exhaust rate by said third exhaust unit and an exhaust rate by said fourth exhaust unit.

28. An apparatus according to claim 27, wherein all of said plurality of optical elements are reflecting optical elements.

29. An apparatus according to claim 27, wherein a wavelength of the light is between 0.1 nm to 30 nm.

30. An apparatus according to claim 17, wherein pressure in said first vacuum chamber is lower than pressure in said fourth vacuum chamber.

31. An apparatus according to claim 30, wherein all of said plurality of optical elements are reflecting optical elements.

32. An apparatus according to claim 30, wherein a wavelength of the light is between 0.1 nm to 30 nm.

33. An apparatus according to claim 17, wherein all of said plurality of optical elements are reflecting optical elements.

34. An apparatus according to claim 17, wherein a wavelength of the light is between 0.1 nm to 30 nm.

35. An apparatus according to claim 1, further comprising a member which defines the second opening.

36. An apparatus according to claim 35, wherein all of said plurality of optical elements are reflecting optical elements.

37. An apparatus according to claim 35, wherein a wavelength of the light is between 0.1 nm to 30 nm.

38. An apparatus according to claim 1, further comprising a gas supply unit which supplies inert gas into said second vacuum chamber.

39. An apparatus according to claim 38, wherein the inert gas is one of helium, nitrogen and argon.

40. An apparatus according to claim 39, wherein all of said plurality of optical elements are reflecting optical elements.

41. An apparatus according to claim 39, wherein a wavelength of the light is between 0.1 nm to 30 nm.

42. An apparatus according to claim 38, wherein a feed rate of the inert gas by said gas supply unit is controlled in accordance with pressure in said second vacuum chamber.

43. An apparatus according to claim 42, wherein all of said plurality of optical elements are reflecting optical elements.

44. An apparatus according to claim 42, wherein a wavelength of the light is between 0.1 nm to 30 nm.

45. An apparatus according to claim 38, wherein all of said plurality of optical elements are reflecting optical elements.

46. An apparatus according to claim 38, wherein a wavelength of the light is between 0.1 nm to 30 nm.

47. An apparatus according to claim 1, wherein said third vacuum chamber includes a plurality of vacuum chambers communicating with one another.

48. An apparatus according to claim 1, wherein all of said plurality of optical elements are reflecting optical elements.

49. An apparatus according to claim 1, wherein a wavelength of the light is between 0.1 nm to 30 nm.

50. A device manufacturing method comprising steps of:
- exposing an object to a pattern using an exposure apparatus as recited in claim 1; and
- developing the exposed object.

51. An apparatus according to claim 1, further comprising:
- a member arranged in said first vacuum chamber, and cooled by a cooling mechanism.

52. An apparatus according to claim 51, wherein pressure in said first vacuum chamber is not less than 5 Pa.

53. An exposure apparatus comprising:
- a projection optical system which has a plurality of optical elements, and directs light from an original to an object to be exposed;
- a first stage which holds the original;
- a first vacuum chamber which contains said first stage; and
- a second vacuum chamber which is adjacent to said first vacuum chamber, contains a part of said plurality of optical elements, and communicates with said first vacuum chamber through a first opening,
- wherein pressure in said second vacuum chamber is higher than pressure in said first vacuum chamber.

54. An apparatus according to claim 53, wherein all of said plurality of optical elements are reflecting optical elements.

55. An apparatus according to claim 53, wherein a wavelength of the light is between 0.1 nm to 30 nm.

56. A device manufacturing method comprising steps of:
- exposing an object to a pattern using an exposure apparatus as recited in claim 53; and
- developing the exposed object.

57. An apparatus according to claim 53, further comprising:
- a member arranged in said first vacuum chamber, and cooled by a cooling mechanism.

* * * * *

UNITED STATES PATENT AND TRADEMARK OFFICE
CERTIFICATE OF CORRECTION

PATENT NO. : 7,391,498 B2  
APPLICATION NO. : 10/949184  
DATED : June 24, 2008  
INVENTOR(S) : Tatsuya Hayashi Page 1 of 1

It is certified that error appears in the above-identified patent and that said Letters Patent is hereby corrected as shown below:

In the Specification:

Column 2, line 18: please delete "waver" and insert therefor -- wafer --;

Column 6, line 45: please delete "However, The" and insert therefor -- However, the --;

Column 6, line 64: please delete "produced form" and insert therefor -- produced from --;

Column 7, line 11: please delete "mark A" and insert therefor -- mark Δ --;

Column 7, line 19: please delete "pervert" and insert therefor -- prevent --.

Signed and Sealed this

Thirtieth Day of September, 2008

JON W. DUDAS  
*Director of the United States Patent and Trademark Office*